US012588368B2

(12) United States Patent
Xu

(10) Patent No.: US 12,588,368 B2
(45) Date of Patent: Mar. 24, 2026

(54) LIGHT-TRANSMITTING DISPLAY MODULE, DISPLAY PANEL AND METHOD FOR MANUFACTURING THE SAME

(71) Applicant: Hefei Visionox Technology Co., Ltd., Anhui (CN)

(72) Inventor: Xiaowei Xu, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 642 days.

(21) Appl. No.: 17/991,308

(22) Filed: Nov. 21, 2022

(65) Prior Publication Data

US 2023/0083071 A1 Mar. 16, 2023

Related U.S. Application Data

(63) Continuation of application No. PCT/CN2021/099177, filed on Jun. 9, 2021.

(30) Foreign Application Priority Data

Sep. 17, 2020 (CN) .......................... 202010979680.1

(51) Int. Cl.
*H10K 59/122* (2023.01)
*H10K 50/822* (2023.01)
(Continued)

(52) U.S. Cl.
CPC ......... *H10K 59/122* (2023.02); *H10K 50/822* (2023.02); *H10K 71/00* (2023.02); *H10K 59/1201* (2023.02); *H10K 59/35* (2023.02)

(58) Field of Classification Search
None
See application file for complete search history.

(56) References Cited

U.S. PATENT DOCUMENTS 12,324,318 B2 * 6/2025 Xu ..................... H10K 59/8052
2015/0076456 A1 3/2015 Choi et al.

FOREIGN PATENT DOCUMENTS

CN 110301053 A 10/2019
CN 110783485 A 2/2020
(Continued)

OTHER PUBLICATIONS

International Search Report issued on Aug. 27, 2021, in corresponding International Application No. PCT/CN2021/099177, 7 pages.
(Continued)

*Primary Examiner* — Michelle Mandala
(74) *Attorney, Agent, or Firm* — Maier & Maier, PLLC

(57) ABSTRACT

A light-transmitting display module. The light-transmitting display module includes: a substrate; a pixel definition layer, located on the substrate and including an isolation structure and at least one pixel opening encircled by the isolation structure; a nucleation inhibiting layer, located on a side of the pixel definition layer facing away from the substrate and including a plurality of inhibiting units, a first orthographic projection of the inhibiting unit on the pixel definition layer covering at least a part of the isolation structure, and at least a part of the inhibiting units being spaced apart from one another; a first common electrode, located on the side of the pixel definition layer facing away from the substrate, a second orthographic projection of the first common electrode on the pixel definition layer covering at least a part of an area other than the first orthographic projection.

16 Claims, 6 Drawing Sheets

(51) Int. Cl.
     *H10K 59/12*      (2023.01)
     *H10K 71/00*      (2023.01)
     *H10K 59/35*      (2023.01)

(56)                References Cited

FOREIGN PATENT DOCUMENTS

| | | | |
|---|---|---|---|
| CN | 110785867 | A | 2/2020 |
| CN | 110867523 | A | 3/2020 |
| CN | 108496260 | B | 5/2020 |
| CN | 111146363 | A | 5/2020 |
| CN | 210575958 | U | 5/2020 |
| CN | 111463356 | A | 7/2020 |
| CN | 111584591 | A | 8/2020 |
| CN | 112054048 | A | 12/2020 |
| WO | 2020105015 | A1 | 5/2020 |

OTHER PUBLICATIONS

Office Action issued on Jan. 21, 2022, in related Chinese Patent Application No. 202010979680.1, 12 pages.
Office Action issued on May 19, 2022, in related Chinese Patent Application No. 202010979680.1, 7 pages.

\* cited by examiner

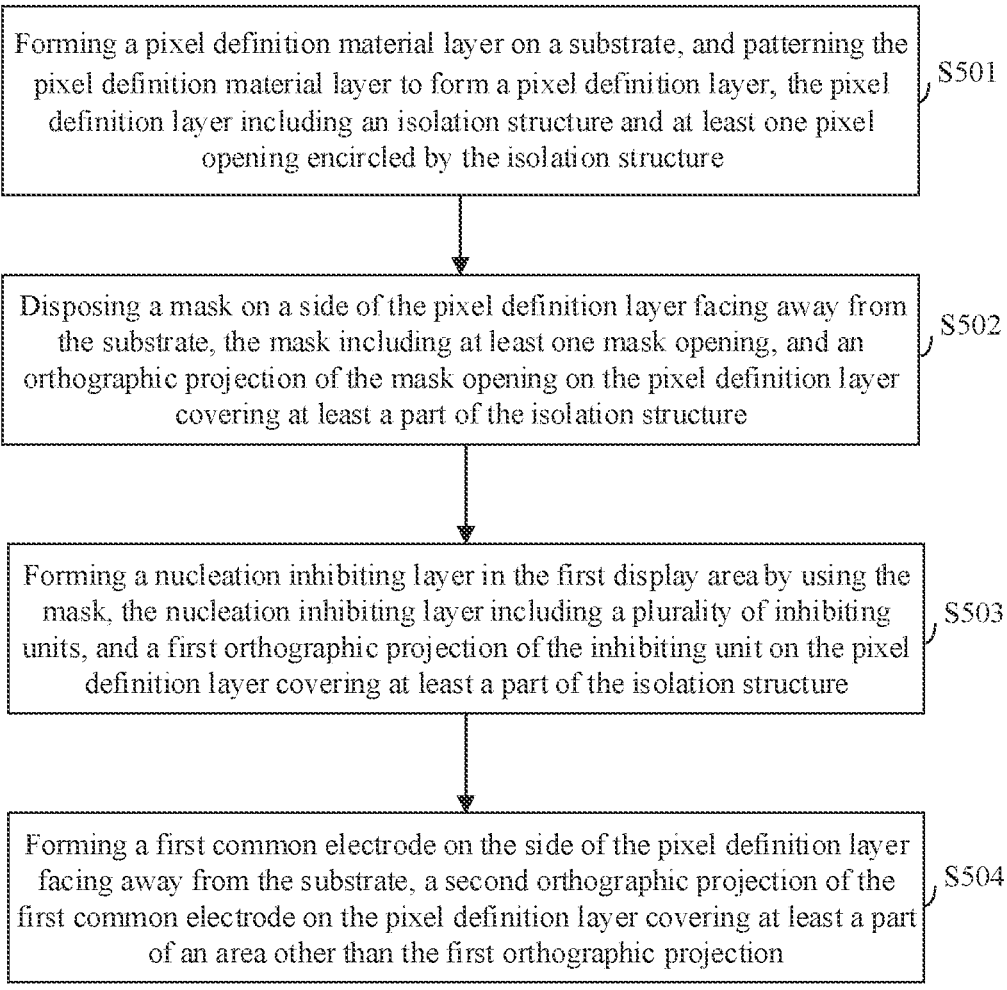

Forming a pixel definition material layer on a substrate, and patterning the pixel definition material layer to form a pixel definition layer, the pixel definition layer including an isolation structure and at least one pixel opening encircled by the isolation structure          S501

Disposing a mask on a side of the pixel definition layer facing away from the substrate, the mask including at least one mask opening, and an orthographic projection of the mask opening on the pixel definition layer covering at least a part of the isolation structure          S502

Forming a nucleation inhibiting layer in the first display area by using the mask, the nucleation inhibiting layer including a plurality of inhibiting units, and a first orthographic projection of the inhibiting unit on the pixel definition layer covering at least a part of the isolation structure          S503

Forming a first common electrode on the side of the pixel definition layer facing away from the substrate, a second orthographic projection of the first common electrode on the pixel definition layer covering at least a part of an area other than the first orthographic projection          S504

Fig. 5

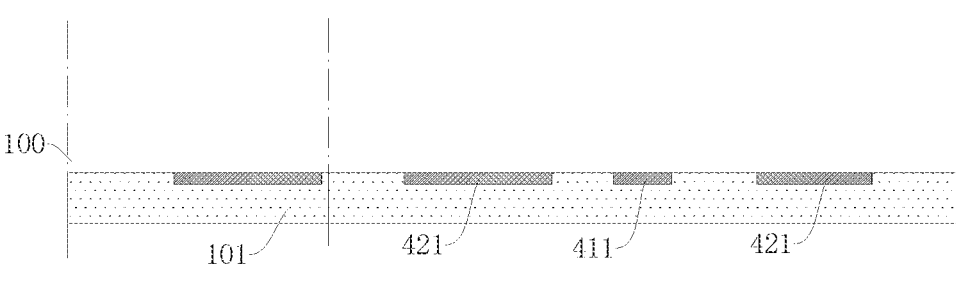

LIGHT-TRANSMITTING DISPLAY MODULE, DISPLAY PANEL AND METHOD FOR MANUFACTURING THE SAME

CROSS-REFERENCE TO RELATED APPLICATIONS

This application is a continuation of International Application No. PCT/CN2021/099177, filed on Jun. 9, 2021, which claims priority to Chinese Patent Application No. 202010979680.1, filed on Sep. 17, 2020, both of which are hereby incorporated by reference in their entireties.

TECHNICAL FIELD

The present application relates to the field of display, and in particular, to a light-transmitting display module, a display panel and a method for manufacturing the display panel.

BACKGROUND

With the rapid development of electronic devices, requirements of users on screen-to-body ratios become more become higher and higher, so that full-screen displays of electronic devices are getting more and more attention of the industry.

Conventional electronic devices, such as cell phones and tablets, require integration of components such as front cameras, earphones, and infrared sensing elements. In the prior art, notches or holes may be provided on the display screens, so that external light can reach photosensitive elements under the screens through the notches or holes on the screens. However, these electronic devices are not literally full-screen devices. Not all areas across their entire screens can be used for display, for example, areas corresponding to their front cameras cannot be used for display.

SUMMARY

The present application provides a light-transmitting display module, a display panel and a method for manufacturing the display panel, so that at least an area of the display panel can be light-transmitting and used for display, thus facilitating under-screen integration of a photosensitive component.

A first aspect of the present application provides a light-transmitting display module including: a substrate; a pixel definition layer, located on the substrate, the pixel definition layer including an isolation structure and at least one pixel opening encircled by the isolation structure; a nucleation inhibiting layer, located on a side of the pixel definition layer facing away from the substrate, the nucleation inhibiting layer including a plurality of inhibiting units, a first orthographic projection of the inhibiting unit on the pixel definition layer covering at least a part of the isolation structure, and at least a part of the inhibiting units being spaced apart from one another; a first common electrode, located on the side of the pixel definition layer facing away from the substrate, a second orthographic projection of the first common electrode on the pixel definition layer covering at least a part of an area other than the first orthographic projection.

A second aspect of the present application provides a display panel including a first display area and a second display area. A light transmittance of the first display area is greater than a light transmittance of the second display area. The display panel includes the light-transmitting display module according to any embodiment in the above-mentioned first aspect. The light-transmitting display module is located in the first display area.

A third aspect of the present application further provides a method for manufacturing a display panel, the display panel including a first display area and a second display area. A light transmittance of the first display area is greater than a light transmittance of the second display area. The method includes:

forming a pixel definition material layer on a substrate, and patterning the pixel definition material layer to form a pixel definition layer, the pixel definition layer including an isolation structure and at least one pixel opening encircled by the isolation structure;

disposing a mask on a side of the pixel definition layer facing away from the substrate, the mask including at least one mask opening, and an orthographic projection of the mask opening on the pixel definition layer covering at least a part of the isolation structure;

forming a nucleation inhibiting layer in the first display area by using the mask, the nucleation inhibiting layer including a plurality of inhibiting units, and a first orthographic projection of the inhibiting unit on the pixel definition layer covering at least a part of the isolation structure;

forming a first common electrode on the side of the pixel definition layer facing away from the substrate, a second orthographic projection of the first common electrode on the pixel definition layer covering at least a part of an area other than the first orthographic projection.

The light-transmitting display module provided by the embodiments of the present application includes the pixel definition layer, the nucleation inhibiting layer and the first common electrode. The first orthographic projections of the plurality of inhibiting units of the nucleation inhibiting layer on the pixel definition layer covers at least a part of the isolation structure. The second orthographic projection of the first common electrode on the pixel definition layer covers at least a part of the area other than the first orthographic projection. The inhibiting units are disposed on at least a part of the isolation structure. Therefore, the first common electrode is not disposed on at least a part of the isolation structure. The occupation area of the first common electrode is small, so that the light transmittance of the light-transmitting display module can be improved. The inhibiting unit is not disposed in the pixel opening, and the first common electrode is disposed in the pixel opening, so that the normal display operation of the light-transmitting display module is not affected. Therefore, in the present application, the light transmittance of the light-transmitting display module can be improved while the normal display operation of the light-transmitting display module is not affected, thus facilitating the under-screen integration of the photosensitive component on a side of the light-transmitting display module.

BRIEF DESCRIPTION OF THE DRAWINGS

FIG. 5 illustrates a flowchart of a method for manufacturing a display panel according to an embodiment of the present application.

FIG. 6 to FIG. 12 are views illustrating a formation process of a display panel.

DETAILED DESCRIPTION

Features and exemplary embodiments of various aspects of the present application will be described in detail below. In order to make the objects, technical solutions and advantages of the present application clearer, the present application is further described in detail below with reference to the drawings and specific embodiments. It should be understood that, specific embodiments described herein are only for the illustration of the present application, not for limiting the present application.

In an electronic device such as a cell phone and a tablet, a photosensitive component, e.g., a front camera, an infrared light sensor and a proximity light sensor, is required to be integrated on a side where a display panel is disposed. In some embodiments, a light-transmitting display area may be provided in the above-described electronic device, and the photosensitive component may be provided on a backside of the light-transmitting display area, so that the electronic device can implement full-screen display while the normal operation of the photosensitive component is ensured.

For a high light transmittance of the light-transmitting display area, the material of a functional layer of the light-transmitting area of the display panel is usually a light-transmitting material. For example, an anode of the light-transmitting area is made of indium tin oxide (ITO) material. However, a light transmittance of a cathode is low, so that it is difficult to improve the light transmittance of the light-transmitting display area while a desired display effect is ensured.

In order to solve the above-mentioned problems, embodiments of the present application provide a light-transmitting display module, a display panel and a method for manufacturing the display panel. The embodiments of the light-transmitting display module, display panel and the method for manufacturing the display panel will be described below with reference to the accompanying drawings.

The embodiments of the present application provide a display apparatus including a display panel. The display apparatus may be, but not limited to, an electronic device such as a cell phone or a tablet.

The display panel may be an organic light emitting diode (OLED) display panel.

The embodiments of the present application provide a display panel, which can be used in the above-mentioned display apparatus.

Figure 1:
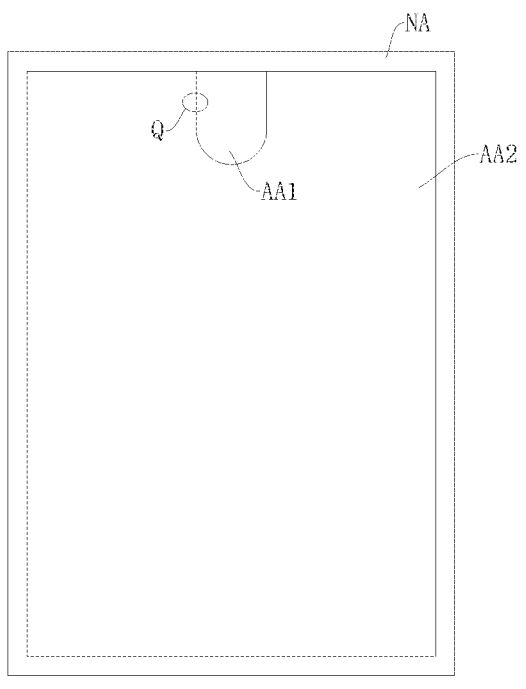
FIG. 1 is a top view of a display panel according to an embodiment of the present application.
Figures 2, 3:
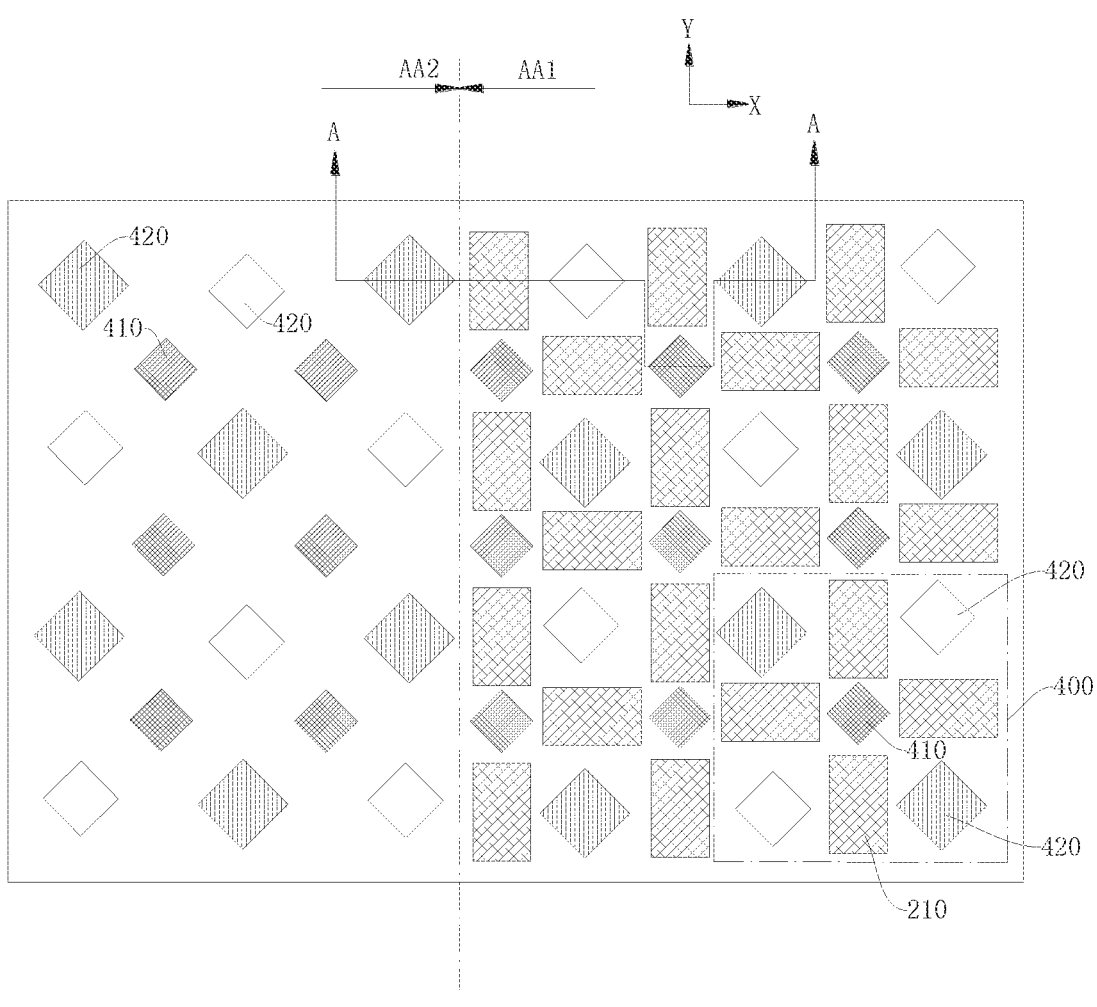
FIG. 2 illustrates an enlarged partial view of the area Q shown in FIG. 1.
FIG. 3 illustrates a cross-sectional view along the line A-A shown in FIG. 2.

As shown in FIG. 1 and FIG. 2, the display panel according to an embodiment of the present application includes a first display area AA1 and a second display area AA2. A light transmittance of the first display area AA1 is greater than a light transmittance of the second display area AA2, that is, the first display area AA1 is a light-transmitting display area.

Optionally, in some other embodiments, the display panel may further include a non-display area NA surrounding the first display area AA1 and the second display area AA2.

The first display area AA1 may be of various shapes, for example, the first display area AA1 is circular, rectangular or of other irregular shapes. The first display area AA1 can be disposed in various positions, for example, the first display area AA1 is located in the middle region of the top portion of the display panel, or the first display area AA1 is close to a corner region of the display panel.

In the present application, the light transmittance of the first display area AA1 is greater than or equal to 15%. In order to ensure that the light transmittance of the first display area AA1 is greater than 15%, greater than 40%, or even higher, light transmittances of functional film layers of the first display area AA1 in the embodiments are each greater than 50%, and light transmittances of at least some of the functional film layers are even greater than 90%.

According to an embodiment of the present application, the light transmittance of the first display area AA1 of the display panel 100 is greater than the light transmittance of the second display area AA2, so that a photosensitive component can be integrated on the backside of the first display area AA1 of the display panel 100, realizing the under-screen integration of a photosensitive component such as a camera, and at the same time, the first display area AA1 can display images, which increases a display area of the display panel 100 and realizes a full-screen design of the display apparatus.

The photosensitive component may be configured in many manners. In some embodiments, the photosensitive component may not be limited to an image capturing apparatus. For example, in some embodiments, the photosensitive component may be a light sensor such as an infrared sensor, a proximity sensor, an infrared lens, a flood sensing element, an ambient light sensor, and a dot matrix projector. In addition, other components may be integrated on a lower surface of the display panel of the display apparatus, such as an earpiece or a speaker.

Reference is made to FIG. 2 and FIG. 3. As shown in FIG. 2, a light-transmitting display module is disposed in the first display area AA1, so as to improve the light transmittance of the first display area AA1. In FIG. 2 and FIG. 3, a boundary between the first display area AA1 and the second display area AA2 is illustrated as a dashed line, but the structure of the display panel according to the embodiments of the present application is not limited thereto.

Specifically, as shown in FIG. 2 and FIG. 3, a light-transmitting display module is provided according to an embodiment of the present application. The light-transmitting display module includes: a substrate 101; a pixel definition layer 100 located on the substrate 101, the pixel definition layer 100 including an isolation structure 110 and at least one pixel opening 120 encircled by the isolation structure 110; a nucleation inhibiting layer located 200 on a side of the pixel definition layer 100 facing away from the substrate 101, the nucleation inhibiting layer 200 including a plurality of inhibiting units 210, a first orthographic projection of the inhibiting unit 210 on the pixel definition layer 100 covering at least a part of the isolation structure 110, and at least a part of the inhibiting units 210 being spaced apart from one another; a first common electrode 300 located on the side of the pixel definition layer 100 facing away from the substrate 101, a second orthographic projection of the first common electrode 300 on the pixel definition layer 100 covering at least a part of an area other than the first orthographic projection.

The light-transmitting display module provided by the embodiments of the present application includes the pixel definition layer 100, the nucleation inhibiting layer 200 and the first common electrode 300. The first orthographic projections of the plurality of inhibiting units 210 of the nucleation inhibiting layer 200 on the pixel definition layer 100 covers at least a part of the isolation structure 110. The second orthographic projection of the first common electrode 300 on the pixel definition layer 100 covers at least a part of the area other than the first orthographic projection. The inhibiting unit 210 is disposed on at least a part of the isolation structure 110, so that the first common electrode 300 is not disposed on at least a part of the isolation structure 110, which can reduce an occupation area of the first common electrode 300 in the light-transmitting display module. The occupation area of the first common electrode 300 is reduced, so that the light transmittance of the light-transmitting display module can be improved. The inhibiting unit 210 is not disposed in the pixel opening 120, and the first common electrode 300 is disposed in the pixel opening 120, so that the normal display operation of the light-transmitting display module is not affected. Therefore, in the present application, the light transmittance of the light-transmitting display module can be improved while the normal display operation of the light-transmitting display module is not affected, thus facilitating the under-screen integration of the photosensitive component on a side of the light-transmitting display module.

Optionally, the nucleation inhibiting layer 200 of the light-transmitting display module may be in direct contact with the pixel definition layer 100, or other layer structure may be disposed between the nucleation inhibiting layer 200 and the pixel definition layer 100. For example, a structure such as a carrier layer is disposed between the nucleation inhibiting layer 200 and the pixel definition layer 100. The carrier layer refers to a carrier-related film layer for realizing functions such as injection, transport, and blocking of carriers (holes or electrons). In some embodiments, the carrier layer may include at least one of a hole inject layer (HIL), a hole transport layer (HTL), an electron blocking layer (EBL), an electron inject layer (EIL), an electron transport layer (ETL), and a hole blocking layer (HBL). The first common electrode 300 is located on the side of the pixel definition layer 100 facing away from the substrate 101. The first common electrode 300 may be in direct contact with the isolation structure of the pixel definition layer 100, or other layer structure may be disposed between the first common electrode 300 and the pixel definition layer 100, such as the above-mentioned carrier layer. It can be understood that, the first common electrode is disposed on the side of a light-emitting layer facing away from the substrate 101, and the pixel electrode, the light-emitting layer and the common electrode form a light-emitting device to realize a light-emitting function.

Optionally, the nucleation inhibiting layer 200 is, for example, an optical external coupling coating layer. The nucleation inhibiting layer 200 can be selectively deposited on the isolation structure 110 by means of evaporation (including thermal evaporation and electron beam evaporation), photolithography, printing and the like.

A material of the nucleation inhibiting layer 200 includes small molecular organic compounds, polymers, organometallic compounds and/or inorganic compounds and elements. The nucleation inhibiting layer 200 makes certain materials such as magnesium not likely to be deposited on its surface. For example, when the material of the nucleation inhibiting layer 200 includes an organic material, magnesium is not likely to be deposited on the surface of the nucleation inhibiting layer 200. The material of the first common electrode 300 includes, for example, magnesium, and the nucleation inhibiting layer 200 is configured to inhibit the first common electrode 300 from being formed on the surface of the nucleation inhibiting layer 200. That is, the first common electrode 300 is inhibited from being formed on the inhibiting unit 210, and the first common electrode 300 is not formed on the surface of the inhibiting unit 210 facing away from the isolation structure 110. After the nucleation inhibiting layer 200 is formed on the isolation structure 110, in the formation of the first common electrode on the pixel definition layer 100, the first common electrode 300 will not be formed on the inhibiting unit 210. Therefore, at least a part of the isolation structure 110 is not covered by the first common electrode 300.

Figure 4:
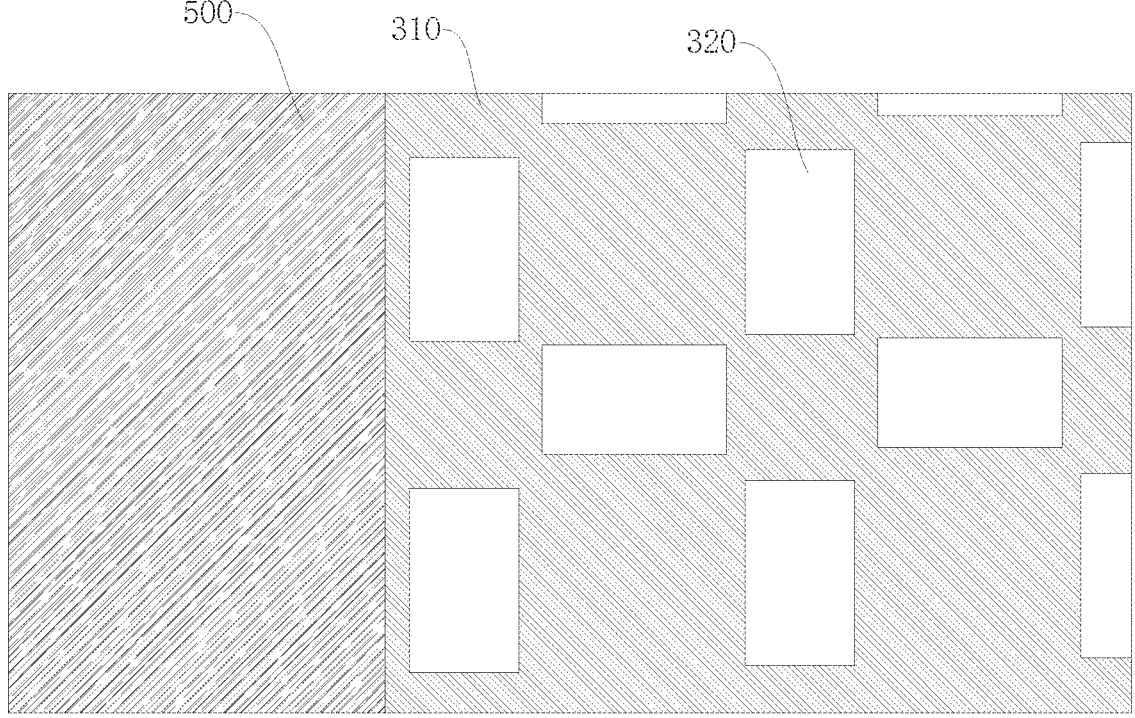
FIG. 4 illustrates a schematic view of a partial layer structure in a display panel according to an embodiment of the present application.

As shown in FIG. 4, in some optional embodiments, the first common electrode 300 includes a body portion 310 and a plurality of hollow portions 320 extending through the body portion 310 and spaced apart from one another. An orthographic projection of the hollow portion 320 in a thickness direction of the light-transmitting display module covers an orthographic projection of at least a part of the isolation structure 110 in the thickness direction, and the inhibiting unit 210 is located in the hollow portion 320.

In these optional embodiments, the plurality of hollow portions 320 are spaced apart from one another, so that the first common electrode 300 can form a contiguous single layer via the body portion 310 between two adjacent hollow portions 320. Portions of the first common electrode 300 in different pixel openings 120 are connected to one another. Moreover, the first common electrode 300 are provided with the hollow portions 320, and an inhibiting unit 210 is disposed in each hollow portion 320, which can reduce the area of the first common electrode 300 and improve the light transmittance of the light-transmitting module.

The material of the first common electrode 300 includes magnesium weighted greater than or equal to 95% of the first common electrode 300. Magnesium constitutes a high proportion of the material of the first common electrode 300, which can improve the light transmittance of the first common electrode 300.

In some optional embodiments, a thickness of the nucleation inhibiting layer 200 ranges from 10 angstroms to 100 angstroms. When the thickness of the nucleation inhibiting layer 200 is within the above range, it can not only be ensured that the surface of the nucleation inhibiting layer 200 has a sufficiently small adhesion, so that the first common electrode 300 cannot be formed on the surface of the inhibiting units 210, but also avoid that the nucleus inhibiting layer is too thick and causes the inhibiting units 210 to spread to a non-designated region, so that enlargement of a coverage area of the inhibiting unit 210 is avoided.

The size of the inhibiting unit 210 is not limited herein, as long as the inhibiting units 210 are located on the isolation structure 110 and are not located in the pixel opening 120, and does not affect the formation of the first common electrode 300 in the pixel opening 120. Optionally, a minimum width of the inhibiting unit 210 is greater than or equal to 5 μm. The inhibiting units 210 have large areas, which can improve the light transmittance of the light-transmitting display module.

In some optional embodiments, the minimum distance between the inhibiting unit 210 and the pixel opening 120 is greater than or equal to 10 μm. The minimum distance between the inhibiting unit 210 and the pixel opening 120 is within the above range, which can prevent the inhibiting unit 210 from spreading to the pixel opening 120, thereby preventing the first common electrode 300 from being unable to be formed in the pixel opening 120 and affecting the display.

The display panel according to an embodiment of the present application further includes a second common electrode 500 located in the second display area AA2, and the second common electrode 500 includes a magnesium-silver alloy layer. In the display panel according to an embodiment of the present application, the second common electrode 500 in the second display area AA2 includes the magnesium-silver alloy layer, and the magnesium-silver alloy layer has a good electrical conductivity, which can alleviate color shift between viewing angles and improve display uniformity of the second display area AA2.

In a material of the magnesium-silver alloy layer, a weight ratio of magnesium to silver ranges from 1/15 to 1/9.

In some optional embodiments, the light-transmitting display module further includes a first pixel group 400 including at least one first sub-pixel 410 and a plurality of second sub-pixels 420. The first sub-pixel 410 is surrounded by the plurality of second sub-pixels 420. The inhibiting unit 210 is located around the first sub-pixel 410, and the inhibiting unit 210 is located between two adjacent second sub-pixels 420.

In these optional embodiments, the inhibiting unit 210 is located around the first sub-pixel 410, and the inhibiting unit 210 is located between two adjacent second sub-pixels 420. The inhibiting units 210 are distributed, which can improve the light transmittance of the light-transmitting display module and current flow allowance of the first common electrode 300.

Optionally, multiple second sub-pixels 420 are evenly distributed around a first sub-pixel 410. Inhibiting units 210 are uniformly distributed around a first sub-pixel 410. The display effect can be improved.

Optionally, four second sub-pixels 420 are disposed around one first sub-pixel 410, and the four second sub-pixels 420 are uniformly distributed around the first sub-pixel 410.

Optionally, the first sub-pixel 410 is a green sub-pixel, and the plurality of second sub-pixels 420 include a red sub-pixel and a blue sub-pixel.

Optionally, the light-transmitting display module includes a plurality of first pixel groups 400 disposed in an array along a first direction and a second direction. Along the first direction, a first sub-pixel 410 is disposed between two adjacent first pixel groups 400. Along the second direction, a first sub-pixel 410 is disposed between two adjacent first pixel groups 400. A plurality of the first sub-pixels 410 in the light-transmitting display module are disposed in an array along the first direction and the second direction. Along the first direction and the second direction, the red sub-pixels and the blue sub-pixels are alternately disposed.

Reference is still made to FIG. 2. The display panel includes red sub-pixels, blue sub-pixels and green sub-pixels. The plurality of second sub-pixels 420 are disposed in an array along the first direction and the second direction, that is, the red sub-pixels and the blue sub-pixels are located in same rows and same columns and are arranged in an array along the first direction and the second direction. In a row along the first direction, red sub-pixels and blue sub-pixels are alternately disposed, and in a column along the second direction, red sub-pixels and blue sub-pixels are alternately disposed. The first sub-pixels 410 disposed in sequence along the first direction are located between two adjacent rows of second sub-pixels 420, that is, the green sub-pixels are located between two adjacent rows of red sub-pixels and blue sub-pixels. The first sub-pixels 410 disposed in sequence along the second direction are located between two adjacent columns of second sub-pixels 420, that is, the green sub-pixels are located between two adjacent columns of red sub-pixels and blue sub-pixels. In the first display area AA1, an inhibiting unit 210 is disposed between two adjacent second sub-pixels 420, that is, an inhibiting unit 210 is disposed between adjacent red and blue sub-pixels along the first direction, and an inhibiting unit 210 is disposed between adjacent red and blue sub-pixels along the second direction.

In the first pixel group 400, the sizes of the first sub-pixels 410 and the second sub-pixels 420 may be set in various ways. For example, the size of the first sub-pixel 410 is smaller than the size of the second sub-pixel 420. The sizes of the plurality of the second sub-pixels 420 may be the same or different.

In some embodiments, the light-transmitting display module further includes a first pixel circuit (not shown in the drawings). The first pixel circuit is electrically connected to the first sub-pixels 410 or the second sub-pixels 420 for driving the display operations of the first sub-pixels 410 or the second sub-pixels 420. Multiple first pixel circuits may be provided and each electrically connected to their corresponding first type sub-pixels 410 and second sub-pixels 420.

In some embodiments, a circuit structure of the first pixel circuit is any one of a 2T1C circuit, a 7T1C circuit, a 7T2C circuit, or a 9T1C circuit. Here, "2T1C circuit" refers to a pixel circuit including two thin film transistors (T) and one capacitor (C), configurations of other circuits such as "7T1C circuit", "7T2C circuit" and "9T1C circuit" can be understood similarly.

In some embodiments, the display panel 100 may further include a second pixel circuit located in the second display area AA2 and electrically connected to the sub-pixels in the second display area AA2 for driving display operations of the sub-pixels in the second display area AA2. In some embodiments, the circuit structure of the second pixel circuit may be any one of the 2T1C circuit, the 7T1C circuit, the 7T2C circuit, or the 9T1C circuit.

In some embodiments, the light-transmitting display module further includes the substrate 101 and a device layer (not shown in the drawings) located on the substrate 101. The first pixel circuit is located in the device layer. The pixel definition layer 100 is located on the device layer.

The substrate 101 may be made of light-transmitting materials such as glass or polyimide (PI). The device layer may include pixel circuits for driving display operations of sub-pixels.

The at least one pixel opening 120 of the pixel definition layer 100 includes a first pixel opening and a second pixel opening. Optionally, when the light-transmitting display module is used in a display panel, the at least one pixel opening 120 includes a first pixel opening and a second pixel opening located in the first display area AA1. The at least one pixel opening 120 further includes a third pixel opening located in the second display area AA2.

The first sub-pixel 410 includes a first light-emitting structure 412 and a first pixel electrode 411. The first light-emitting structure 412 is located in the first pixel opening and on the side of the first common electrode 300 facing the substrate 101. The first pixel electrode 411 is located on the side of the first light-emitting structure 412 facing the substrate 101. The second sub-pixel 420 includes a second light-emitting structure 422 and a second pixel electrode 421. The second light-emitting structure 422 is located in the second pixel opening 120 and on the side of the first common electrode 300 facing the substrate 101. The second pixel electrode 421 is located on the side of the second light-emitting structure 422 facing the substrate 101.

In these optional embodiments, the first light-emitting structure 412 is disposed between the first pixel electrode 411 and the first common electrode 300. The first pixel electrode 411 and the first common electrode 300, when powered, can drive the first light-emitting structure 412 to emit light. Similarly, the second light-emitting structure 422 is disposed between the second pixel electrode 421 and the first common electrode 300. The second pixel electrode 421 and the first common electrode 300, when powered, can drive the second light-emitting structure 422 to emit light. The inhibiting units 210 are located on the isolation structure 110, and the first common electrode 300 is not disposed on a part of the surface of the isolation structure 110, so that the light-emitting by the first light-emitting structure 412 and the second light-emitting structure 422 will not be affected.

The first light-emitting structure 412 and the second light-emitting structure 422 may each include an OLED light-emitting layer, and depending on the design requirements of the first light-emitting structure 412 and the second light-emitting structure 422, the first light-emitting structure 412 and the second light-emitting structure 422 may each further include at least one of a hole injection layer, a hole transport layer, an electron injection layer or an electron transport layer.

In some embodiments, the first pixel electrode 411 and/or the second pixel electrode 421 are light-transmitting electrodes. In some embodiments, the first pixel electrode 411 and/or the second pixel electrode 421 include an indium tin oxide (ITO) layer or an indium zinc oxide layer. In some embodiments, the first pixel electrode 411 and/or the second pixel electrode 421 are reflective electrodes including a first light-transmitting conductive layer, a reflective layer on the first light-transmitting conductive layer, and a second light-transmitting conductive layer on the reflective layer. The first light-transmitting conductive layer and the second light-transmitting conductive layer may be ITO, indium zinc oxide, etc. The reflective layer may be a metal layer, for example, the reflective layer is made of a silver material. The second pixel electrode 421 may be configured to use the same material as the first pixel electrode 411.

In some embodiments, an orthographic projection of the first light-emitting structure 412 on the substrate 101 comprises one first pattern unit or comprises two or more first pattern units joined together, and the first pattern unit includes at least one selected from a group including a circle, an oval, a dumbbell, a gourd and a rectangle.

In some embodiments, an orthographic projection of the first pixel electrode 411 on the substrate 101 comprises one second pattern unit or comprises two or more second pattern units joined together, and the second pattern unit includes at least one selected from a group including a circle, an oval, a dumbbell, a gourd and a rectangle.

In some embodiments, an orthographic projection of the second light-emitting structure 422 on the substrate 101 comprises one third pattern unit or comprises two or more third pattern units joined together, and the third pattern unit includes at least one selected from a group including a circle, an oval, a dumbbell, a gourd and a rectangle.

In some embodiments, an orthographic projection of the second pixel electrode 421 on the substrate 101 comprises one fourth pattern unit or comprises two or more fourth pattern units joined together, and the fourth pattern unit includes at least one selected from a group including a circle, an oval, a dumbbell, a gourd and a rectangle.

In an example, the light-transmitting display module may further include an encapsulation layer, a polarizer and a cover plate over the encapsulation layer. The cover plate may also be directly disposed over the encapsulation layer without the arrangement of the polarizer, or the cover plate may be directly disposed over the encapsulation layer in at least the first display area AA1 without the arrangement of the polarizer, so as to avoid the influence of the polarizer on amount of light collected by a photosensitive element correspondingly disposed under the first display area AA1. Of course, the polarizer may also be disposed over the encapsulation layer in the first display area AA1.

As shown in FIG. 5, the embodiments of the present application provide a method for manufacturing a display panel. The display panel includes a first display area AA1 and a second display area AA2. A light transmittance of the first display area AA1 is greater than that of the second display area AA2. The method for manufacturing the display panel includes steps S501-S504.

At step S501, a pixel definition material layer is formed on a substrate 101, and the pixel definition material layer is patterned to form a pixel definition layer 100 including an isolation structure 110 and at least one pixel opening 120 encircled by the isolation structure 110.

At step S502, a mask 600 is disposed on a side of the pixel definition layer 100 facing away from the substrate 101. The mask 600 includes at least one mask opening 610. An orthographic projection of the mask opening 610 on the pixel definition layer 100 covers at least a part of the isolation structure 110.

At step S503, a nucleation inhibiting layer 200 is formed in the first display area AA1 by using the mask 600. The nucleation inhibiting layer 200 includes a plurality of inhibiting units 210. A first orthographic projection of the inhibiting unit 210 on the pixel definition layer 100 covers at least a part of the isolation structure 110.

At step S504, a first common electrode 300 is formed on the side of the pixel definition layer 100 facing away from the substrate 101. A second orthographic projection of the first common electrode 300 on the pixel definition layer 100 covers at least a part of an area other than the first orthographic projection.

In the display panel manufactured by using the method for manufacturing the display panel according to an embodiment of the present application, the plurality of inhibiting units 210 of the nucleation inhibiting layer 200 are located on at least a part of the isolation structure 110, and the first common electrode 300 is located at least a part of the area other than the area where the inhibiting units 210 are located. The inhibiting units 210 are disposed on at least a part of the isolation structure 110. Therefore, the first common electrode 300 is not disposed on at least a part of the isolation structure 110. The occupation area of the first common electrode 300 is small, so that the light transmittance of the light-transmitting display module can be improved. The inhibiting unit 210 is not disposed in the pixel opening 120, and the first common electrode 300 is disposed in the pixel opening 120, so that the normal display operation of the light-transmitting display module is not affected. Therefore, in the present application, the light transmittance of the light-transmitting display module can be improved while the normal display operation of the light-transmitting display module is not affected, thus facilitating the under-screen integration of the photosensitive component on a side of the light-transmitting display module.

Optionally, before the step S502 or after the step S504, the method for manufacturing the display panel further includes: forming a second common electrode 500 on the side of the pixel definition layer 100 facing away from the substrate 101, the second common electrode 500 being formed in the second display area AA2.

The second common electrode 500, for example, includes the magnesium-silver alloy layer, which can ensure a desired conductivity of the second common electrode 500 and improve the display effect of the display panel.

Taking the display panel shown in FIG. 3 as an example, with reference to FIG. 6 to FIG. 12, the method for manufacturing the display panel provided by the present application is detailed. The method for manufacturing the display panel provided by an embodiment of the present application includes Steps 1-3.

At step 1, as shown in FIG. 6, the first pixel electrodes 411 and the second pixel electrodes 421 are formed on an array substrate. The array substrate includes, for example, a substrate 101 and a device layer.

Figure 7:
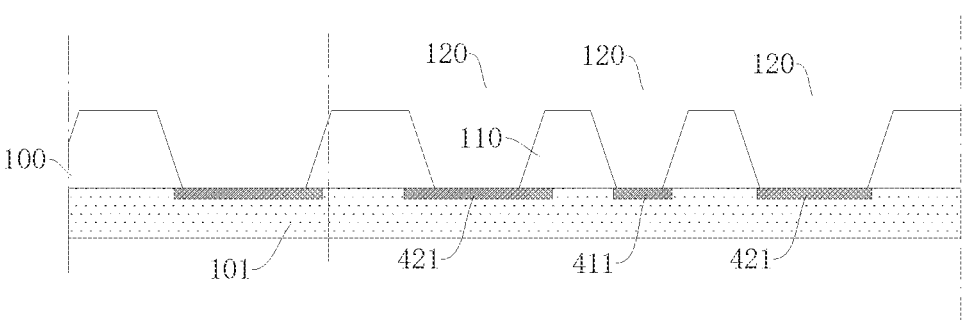

At step 2, as shown in FIG. 7, the pixel definition layer 100 is formed on the first pixel electrodes 411 and the second pixel electrodes 421. The pixel definition layer 100 includes the isolation structure 110 and the pixel opening 120 encircled by the isolation structure 110.

Figure 8:
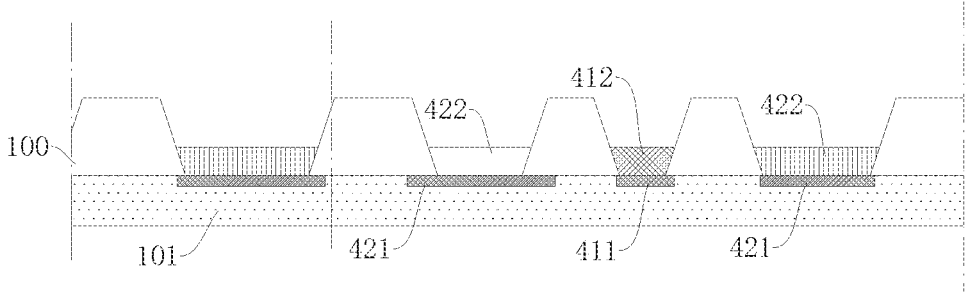

At step 3, as shown in FIG. 8, light-emitting structures are formed in the pixel opening 120. The light-emitting structures includes the first light-emitting structures 412 and the second light-emitting structures 422.

Figure 9:
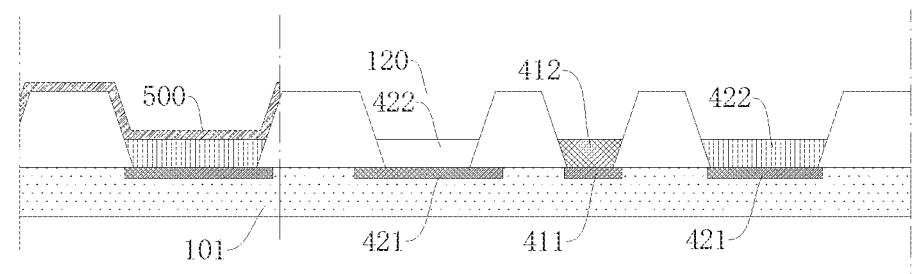

At step 4, as shown in FIG. 9, the second common electrode 500 is formed on the pixel definition layer 100. The second common electrode 500 is located in the second display area AA2.

Figure 10:
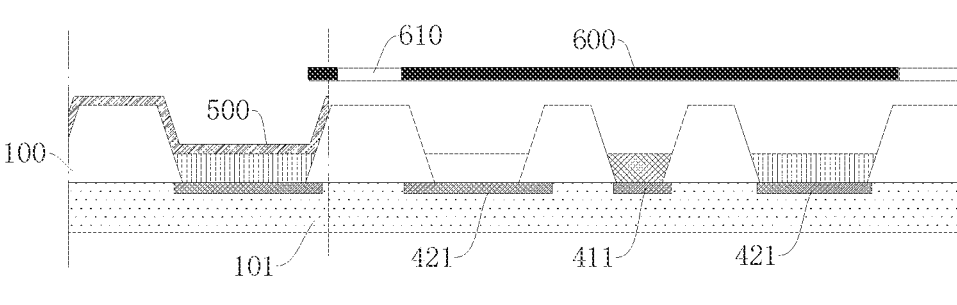

At step 5, as shown in FIG. 10, the pixel definition layer 100 is covered with the mask 600. The mask 600 includes the mask openings 610, and the orthographic projection of each mask opening 610 on the pixel definition layer 100 covers at least a part of the isolation structure 110.

Figure 11:
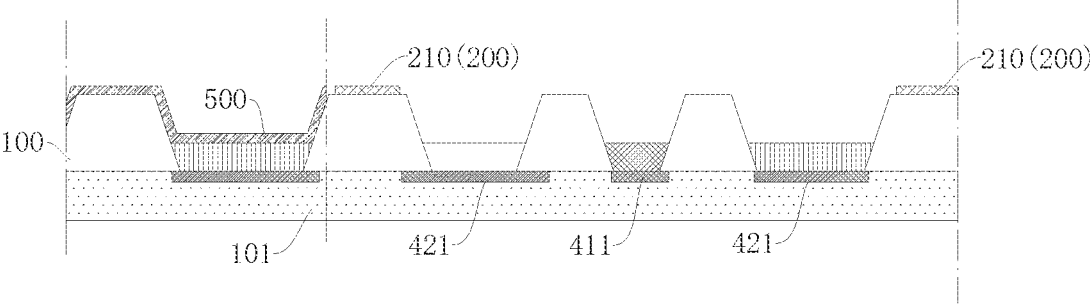

At step 6, as shown in FIG. 11, the nucleation inhibiting layer 200 is formed in the first display area AA1 by means of evaporation or printing, etc. The nucleation inhibiting layer 200 includes a plurality of inhibiting units 210. The inhibiting units 210 are formed on the side of the isolation structure 110 facing away from the substrate 101 through the mask openings 610.

Figure 12:
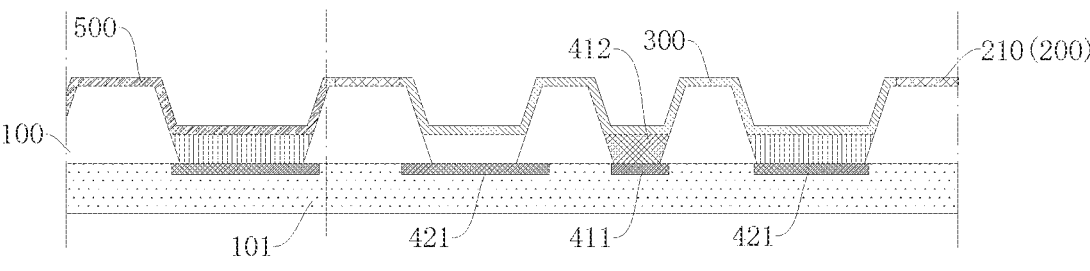

At step 7, as shown in FIG. 12, the first common electrode 300 is formed on the side of the pixel definition layer 100 facing away from the substrate 101. The second orthographic projection of the first common electrode 300 on the pixel definition layer 100 covers at least a part of the area other than the first orthographic projection.

In some other optional embodiments, when the materials of the first common electrode 300 and the second common electrode 500 are the same, step 6 may be performed directly after step 3 to form the nucleation inhibiting layer 200, and then the same step may be performed to form the first common electrode 300 and the second common electrode 500.

The detailed description of these embodiments are for a better explanation of principles and practical applications of the present application, to thereby enable those skilled in the art to best utilize the present application and various embodiments with various modifications.

What is claimed is:

1. A light-transmitting display module, comprising:
a substrate;
a pixel definition layer, located on the substrate, the pixel definition layer comprising an isolation structure and at least one pixel opening encircled by the isolation structure;

a nucleation inhibiting layer, located on a side of the pixel definition layer facing away from the substrate, the nucleation inhibiting layer comprising a plurality of inhibiting units, a first orthographic projection of the inhibiting unit on the pixel definition layer covering at least a part of the isolation structure, and at least a part of the inhibiting units being spaced apart from one another;

a first common electrode, located on the side of the pixel definition layer facing away from the substrate, a second orthographic projection of the first common electrode on the pixel definition layer covering at least a part of an area other than the first orthographic projection; and a first pixel group, comprising at least one first sub-pixel and a plurality of second sub-pixels, the first sub-pixel being surrounded by the plurality of second sub-pixels, wherein the at least one pixel opening comprises a first pixel opening and a second pixel opening;

the first sub-pixel comprises a first light-emitting structure and a first pixel electrode, the first light-emitting structure is located in the first pixel opening, the first light-emitting structure is located on a side of the first common electrode facing the substrate, and the first pixel electrode is located on a side of the first light-emitting structure facing the substrate;

the second sub-pixel comprises a second light-emitting structure and a second pixel electrode, the second light-emitting structure is located in the second pixel opening, the second light-emitting structure is located on a side of the first common electrode facing the substrate, and the second pixel electrode is located on a side of the second light-emitting structure facing the substrate.

2. The light-transmitting display module according to claim 1, wherein the first common electrode comprises a body portion and a plurality of hollow portions extending through the body portion and spaced apart from one another, and an orthographic projection of the hollow portion in a thickness direction of the light-transmitting display module covers an orthographic projection of the at least a part of the isolation structure in the thickness direction, and the inhibiting unit is located in the hollow portion.

3. The light-transmitting display module according to claim 1, wherein a material of the first common electrode comprises magnesium weighted greater than or equal to 95% of the first common electrode.

4. The light-transmitting display module according to claim 1, wherein a thickness of the nucleation inhibiting layer ranges from 10 angstroms to 100 angstroms.

5. The light-transmitting display module according to claim 1, wherein a minimum width of the inhibiting unit is greater than or equal to 5 μm.

6. The light-transmitting display module according to claim 1, wherein a minimum distance between the inhibiting unit and the pixel opening is greater than or equal to 10 μm.

7. The light-transmitting display module according to claim 1,
wherein the inhibiting unit is located around the first sub-pixel, and the inhibiting unit is located between two adjacent second sub-pixels.

8. The light-transmitting display module according to claim 7, wherein one first sub-pixel is surrounded by four second sub-pixels and four inhibiting units.

9. The light-transmitting display module according to claim 7, wherein the first sub-pixel is a green sub-pixel, and the plurality of second sub-pixels comprise a red sub-pixel and a blue sub-pixel.

10. The light-transmitting display module according to claim 1, wherein an orthographic projection of the first light-emitting structure on the substrate comprises one first pattern unit or comprises two or more first pattern units joined together, and the first pattern unit comprises at least one selected from a group comprising a circle, an oval, a dumbbell, a gourd and a rectangle.

11. The light-transmitting display module according to claim 1, wherein an orthographic projection of the first pixel electrode on the substrate comprises one second pattern unit or comprises two or more second pattern units joined together, and the second pattern unit comprises at least one selected from a group comprising a circle, an oval, a dumbbell, a gourd and a rectangle.

12. The light-transmitting display module according to claim 1, wherein an orthographic projection of the second light-emitting structure on the substrate comprises one third pattern unit or comprises two or more third pattern units joined together, and the third pattern unit comprises at least one selected from a group comprising a circle, an oval, a dumbbell, a gourd and a rectangle.

13. The light-transmitting display module according to claim 1, wherein an orthographic projection of the second pixel electrode on the substrate comprises one fourth pattern unit or comprises two or more fourth pattern units joined together, and the fourth pattern unit comprises at least one selected from a group comprising a circle, an oval, a dumbbell, a gourd and a rectangle.

14. A display panel comprising a first display area and a second display area, a light transmittance of the first display area being greater than a light transmittance of the second display area, and the display panel comprising:

the light-transmitting display module according to claim 1, the light-transmitting display module being located in the first display area.

15. The display panel according to claim 14, wherein the display panel further comprises a second common electrode located in the second display area, and the second common electrode comprises a magnesium-silver alloy layer.

16. The display panel according to claim 15, wherein in a material of the magnesium-silver alloy layer, a weight ratio of magnesium to silver ranges from 1/15 to 1/9.

* * * * *